United States Patent [19]
Brush

[11] Patent Number: 5,390,195
[45] Date of Patent: Feb. 14, 1995

[54] MILLER-SQUARED DECODER WITH ERASURE FLAG OUTPUT

[75] Inventor: Richard K. Brush, Los Altos, Calif.

[73] Assignee: Ampex Corporation, Redwood City, Calif.

[21] Appl. No.: 863,602

[22] Filed: Apr. 3, 1992

[51] Int. Cl.$^6$ .................. G06F 11/10; H03M 13/00
[52] U.S. Cl. ..................... 371/37.1; 371/55
[58] Field of Search ............ 371/37.1, 55; 360/40, 360/41, 42, 57; 341/94, 50, 72, 58, 68, 69

[56] References Cited
U.S. PATENT DOCUMENTS

| | | |
|---|---|---|
| Re. 31,311 | 7/1983 | Miller . |
| 3,108,261 | 10/1963 | Miller . |
| 3,810,111 | 5/1974 | Patel . |
| 4,234,897 | 11/1980 | Miller .................. 360/40 |
| 4,357,702 | 11/1982 | Chase et al. ............ 371/47.1 |
| 4,410,877 | 10/1983 | Carasso et al. .......... 360/40 |
| 4,437,086 | 3/1984 | Miller et al. ............ 340/347 |
| 4,454,499 | 6/1984 | Yarborough, Jr. ......... 340/347 |

OTHER PUBLICATIONS

Affidavit of Activities Regarding Ampex ACL Product Line Covering The Period From Sep. 4, 1990 through Apr. 4, 1991, Stephen Atkinson, May 4, 1992.

Primary Examiner—Robert W. Beausoliel, Jr.
Assistant Examiner—Trinh Tu
Attorney, Agent, or Firm—John G. Mesaros; George B. Almeida; James M. Thomson

[57] ABSTRACT

A method and apparatus for the generation of a signal flag in response to illegal channel code patterns from an information channel, the signal flag may typically be used as an erasure flag by a subsequent error correction decoder. This erasure flag, being indicative of a data error position which can then be fed into a utilization circuit such as an error correction logic for performance improvement. In particular, a Miller-squared channel code format decoder in accordance with the present invention can easily and inexpensively provide error position information thereby enhancing error correction power, such as that of a Reed-Solomon error correction code.

33 Claims, 9 Drawing Sheets

NOTE: ? = UNCERTAIN DATA DUE TO PLAYBACK ERROR(S).

MILLER-SQUARED DECODER WITH ERASURE FLAG OUTPUT

BACKGROUND OF THE INVENTION

1. Field of the Invention

This invention generally relates to data transmission and error correction systems. More particularly, it relates to an apparatus and method, for generating data error position information in response to a serial binary data stream using the Miller-squared coding rules, to increase error correction capability.

2. Description of the Prior Art

Data reliability in a digital data information transmission channel is enhanced by error detection and correction. Many error correction coding (ECC) methods are available, such as Reed-Solomon codes, Fire codes, and Hamming codes, all serving to ensure data integrity in the information channel. Data typically undergoes redundancy encoding by an ECC encoder at a transmitting end of the information channel. Prior to transmission, however, this ECC encoded data stream generally is further encoded according to a set of information channel data coding rules. Two of the common channel codes are Manchester codes and the Miller-squared ($M^2$) code. The appropriate channel code is selected based on the nature of the information channel; for example, the Miller-squared ($M^2$) code finds particular applicability to magnetic recording and reproducing channels because it embeds timing information into a data stream (self-clocking), the resulting code stream is direct current free and polarity insensitive. A more complete description of the Miller code and Miller-squared code may be had by reference to Miller U.S. Pat. No. Re. 31,311, dated Jul. 12, 1983 (Miller-squared or $M^2$ code) and Miller U.S. Pat. No. 3,108,261 issued Oct. 22, 1963 (Miller code or the M code).

The Miller-squared code is such that transitions can occur either in the middle of a data cell, or at the boundary between data cells. A data cell or a bit cell refers to an interval in time identifiable by separate timing pulses (clock) containing a logical data bit. There are two $M^2$ code bits per data bit and the $M^2$ encoder and decoder operate at a clock frequency which is twice the serial data rate. This double rate clock is referred to as the $M^2$ clock. There are three rules, constraints or conditions in a $M^2$ code stream such as a playback code stream of a magnetic recorder, which can be easily checked to detect illegal $M^2$ code sequences. These three conditions do not fully define the $M^2$ code but are a consequence of the $M^2$ coding rules, as defined in the U.S. Pat. No. Re. 31,311.

1. The minimum run length between transitions in $M^2$ code is one data cell or two $M^2$ clocks. A shorter run length than this indicates an error in the playback code stream and is referred to as a short run violation.

2. The maximum run length between transitions in $M^2$ code is three data cells or six $M^2$ clocks. A longer run length than this indicates an error in the playback data stream and is referred to as a long run violation.

3. Whenever a run length of two or more data cells (four or more $M^2$ clocks) occurs, the transition beginning the run occurs in the middle of a data cell. This is referred to as an $M^2$ sync sequence since it is used to determine the location of the data cell boundaries in the $M^2$ decoder. If the transition occurs at the boundary of two cells it indicates an error in the playback data stream and is referred to an illegal sync sequence.

An illegal $M^2$ sequence (or a sequence that violates a rule or constraint) is the result of an error in the playback $M^2$ code stream which causes a transition to be shifted; however, not all playback errors result in illegal $M^2$ sequences. When an illegal $M^2$ sequence occurs the $M^2$ decoder will produce an error in the decoded output data, but its location will be uncertain, generally occurring in one of two possible data bits. Thus, it is generally necessary to flag two decoded data bits as uncertain when an illegal $M^2$ sequence is detected.

For transmission, data, including both information and error correction redundancy codes, is first encoded by a set of discrete electrical signals in accordance with the channel coding scheme, at a source terminal, and is subsequently decoded at a data receiving terminal. This channel coding scheme transforms the data and applies in addition to and independently of the error correction method used. This set of electrical signal patterns involve defining certain time relationships among the individual transmission waveforms. The source terminal transmits the individual signals using predefined time relationships so the receiving terminal can recognize each discrete signal as it arrives. These data bits may be recorded or transmitted or may otherwise be recorded on or reproduced from a magnetic tape.

In magnetic tape recording, electromagnetic interference during transmission, media dropout, poor head to tape contact, Gaussian thermal noise and tape surface contamination are sources of errors. Magnetic recording errors generally come in two kinds. There are large corruptions, called error bursts, where numerous bits are corrupted together in an area which is otherwise error free, and random errors affecting single bits. Whatever the mechanism, the result will be that the received data will not be exactly the same as those sent. Sometimes it is enough to know that there has been an error, if time allows a retransmission to be arranged. This is feasible for telex messages, but very inappropriate for others, such as audio or video transmissions.

Each error correction code (ECC) generally includes error detection and error correction functions. In any error correction method the degree of protection used should be appropriate for the probability of errors to be encountered. Since increased error correction ability generally requires greater redundancy and therefore channel bandwidth, as well as complexity, there is a tradeoff in ECC design.

In general, two pieces of independent information are necessary for elucidating two unknowns. In ECC, the position of an error and its value are critical pieces of information. If one of them, such as the error position, is somehow known from an external source, a source outside the scope of the ECC decoder, then an erred message can be corrected as to its exact content even if the other piece of information, such as correct value, is the only piece of information derivable from the ECC decoder in use.

A common ECC is a Reed-Solomon code. In a Reed-Solomon code, like various digital systems data bits are assembled into data words, or symbols. A symbol of any size is possible but a symbol size of eight bits is commonly used because it works conveniently with byte-oriented systems. Eight bit symbols implies a maximum sequence length of $2^8 - 1 = 255$ symbols. This sequence of up to 255 symbols is called a code word. As each symbol contains 8 bits, the code word will be up to:

255×8=2040 bits long. Within the code word, a number of symbols are designated as check symbols. Each check symbol represents a level of redundancy able to provide one piece of error information, such as an error position or value. All error correction relies on adding redundancy to information for transmission.

As an illustration, a Reed Solomon code word of 255 8-bit symbols with 10 check symbols limits data to the remaining 245 symbols. Since an error correction requires two levels of redundancy or two check symbols (one each for position and value), an ECC decoder theoretically can detect and correct up to 5 errors within this code word. In some video and audio applications, it is a better strategy to simply detect the errors without correcting them; then, in that case, up to 10 errors may be detected without correction. When the position of errors is known by some other means, twice as many errors can be corrected for the same amount of redundancy. This gives the name of erasure correction. Erasure correction refers to correcting errors when their locations are known, but their values are unknown. Potentially, having erasure information can double the error correction capability.

In accordance with an aspect of the present invention, there is provided a new and improved Miller-squared decoder which enables output of a signal upon detection of a $M^2$ rule violation, with the signal and data stream then being transmitted to the error correction circuitry.

SUMMARY OF THE INVENTION

The foregoing and other objects of the invention are accomplished by providing a decoder apparatus and method for generating a signal flag output from the decoder, along with, and in timed relation with, the decoded data stream, with the signal flag being indicative of a violation of a selected one or more coding rules. In accordance with the invention, a Miller-square channel code decoder is configured for receiving a serial, binary information stream and generates a signal flag indicative of the position of those decoded data bits which are questionable in their validity. In the preferred embodiment, the signal flag is an erasure flag which refers to a data error whose location is known but whose value is not. The erasure flag signal and the data are transmitted together for subsequent error correction.

In conventional systems, a $M^2$ decoder and an ECC decoder operate independently. That is, the $M^2$ decoder provides no information to the ECC decoder to improve the ECC decoder's performance. In the instant invention, the $M^2$ decoder can detect errors in the playback $M^2$ code stream and flag the decoded data bits which are questionable, then pass this information to the ECC decoder as "erasure" flags to improve ECC decoder performance. These flags travel synchronously along with decoded data on a separate line into the ECC logic. In general, it requires only one check symbol to correct an erasure, whereas it requires two check symbols to correct an error which is not flagged. Thus erasures can potentially double the number of errors which the ECC decoder can correct.

The above objects and advantages of the present invention will no doubt become apparent to those skilled in the art after having read the following detailed description as accompanied by the figures of the drawing.

DESCRIPTION OF THE PREFERRED EMBODIMENTS

Figure 1:
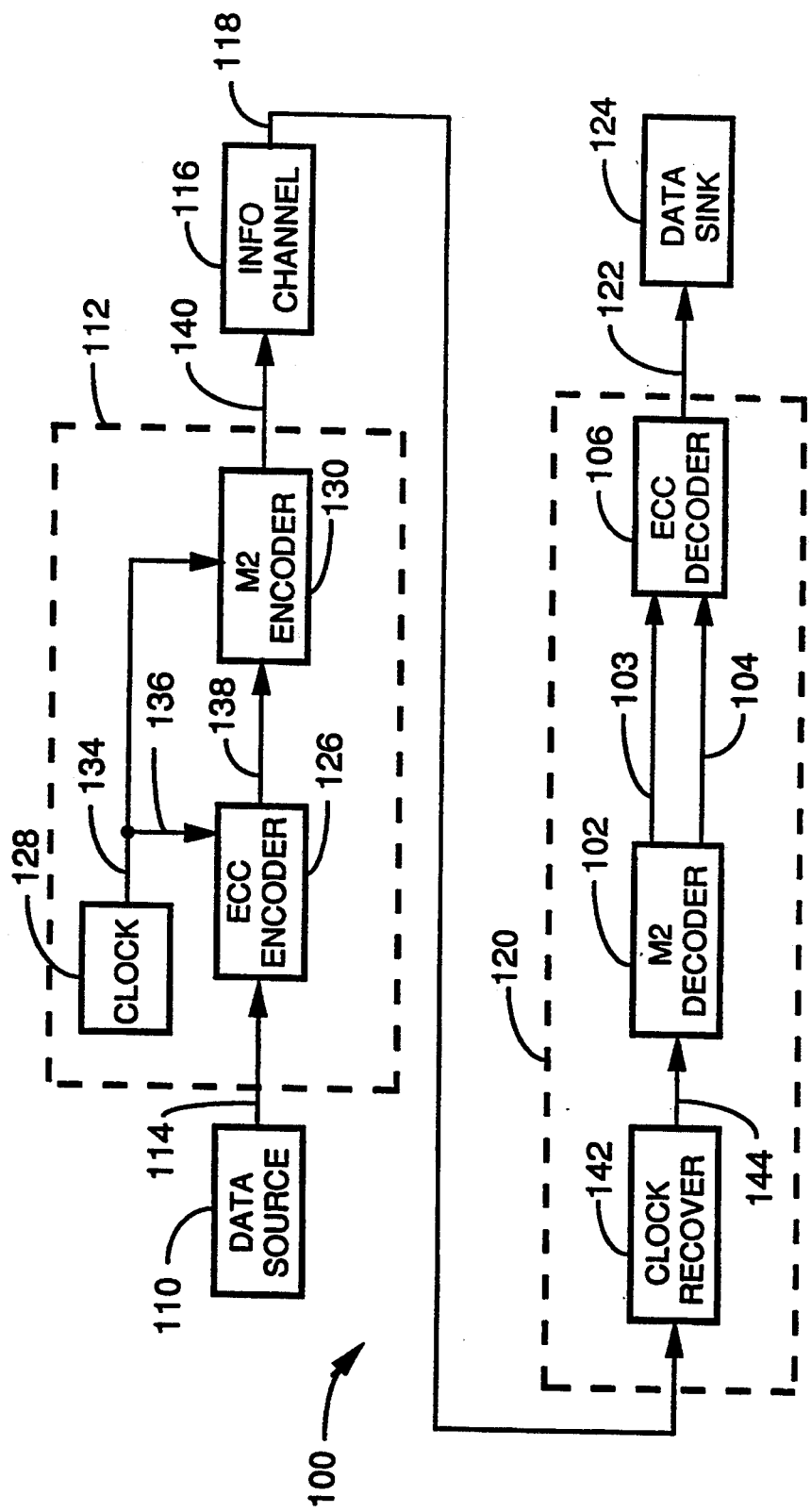
FIG. 1 is a block diagram of a Miller-squared record/playback data channel using error correction coding employing the present invention.

Referring now to the drawings, and more particularly, to FIG. 1, there is shown a block diagram of a system for encoding and decoding binary data before entering and after exiting an information channel respectively, generally designated 100 which includes a Miller-squared decoder 102, the decoder 102 providing a decoded output over a path 103 and further including a signal generation means providing, in response to data errors, an indicator such as an erasure flag over a path 104 to a utilization circuit such as an ECC decoder 106 for error correction improvement.

Data in binary form from a data source 110 is applied to an encoding logic 112 (depicted in broken lines) over a path 114. The data source 110 data may conform to any number of well known data protocols, such as a non-return-to-zero-level (NRZ-L) data code which set the signal at a 1 level or state for the entire bit cell containing a "1" bit and goes to the 0 level or state where there is a "0" state in the bit cell. Thus, there are transitions only when successive bit cells are in different states. An encoded data stream arising out of the encoding logic 112 travels through an information channel 116 and reaches, over a path 118, a decoding logic 120 (shown in broken lines) for data decoding. The decoded data stream is transmitted over a path 122 to a data sink 124 for subsequent utilization.

The encoding logic 112 comprises an ECC encoder 126, a clock generator 128, and a $M^2$ encoder 130. The ECC encoder 126 receives the data source 110 data before the $M^2$ encoder 130 which connects thereto. The dock generator 128 produces periodic timing pulses at an appropriate frequency and phase, to the ECC encoder 126 and the $M^2$ encoder 130 over paths 134, 136 and 134 respectively. The data on the path 114 is docked into the ECC encoder 126 for data redundancy processing such as applying the Reed-Solomon code to ensure data integrity. The ECC encoded data then serially enters the $M^2$ encoder 130 via a path 138 for further encoding according to the $M^2$ channel code rules. This (doubly) encoded data stream transmitted via path 140 is thus encoded to make it inherently capable of detection and correction of a fixed number of data errors in an ECC code word as well as being self-clocking, DC free and polarity insensitive. It is applied to the information channel 116 which may comprise a magnetic tape recorder where the information is recorded and later read out.

The output of the information channel 116 is transferred over path 118 to the decoding logic 120 which includes a clock recovery logic 142, the $M^2$ decoder 102, and the ECC decoder 106. The clock recovery logic 142 receives encoded data over the path 118 to re-establish clocking timing pulses from $M^2$ coding phase transitions. This reconstituted dock information is disseminated to the $M^2$ decoder 102 which receives the $M^2$ clock information as well as the serial encoded data stream from the clock recovery logic 142 via a path 144. A portion of the $M^2$ decoder 102 decodes the incoming data according to the $M^2$ channel code rules returning the data to its original protocol such as the NRZL-L format. Another portion detects data errors in the data stream in response to illegal $M^2$ code patterns, and yet a third portion generates erasure flags thereafter indicative of likely error locations. These erasure flags are sent over the path 104 which is independent of the corresponding data path 103 transmitting data in a synchronous manner therewith.

Both erasure flags and $M^2$ decoded data enter the ECC decoder 106 which utilize erasure flags, over the paths 104 and 103 respectively. The ECC decoder 106 checks through the encoded redundancy for data errors determining both their locations and values. The erasure flags, indicative of likely data error locations from the path 104, serve potentially to double the ECC decoder 106 correction power for the reasons mentioned above., that is, the ECC decoder 106 is being provided with information indicative of error location, a function, which if performed by the decoder, requires additional processing therein. A $M^2$-ECC decoded data stream from the decoding logic 120 is then applied to the data sink 124 over the path 122 for subsequent utilization.

Figure 2:
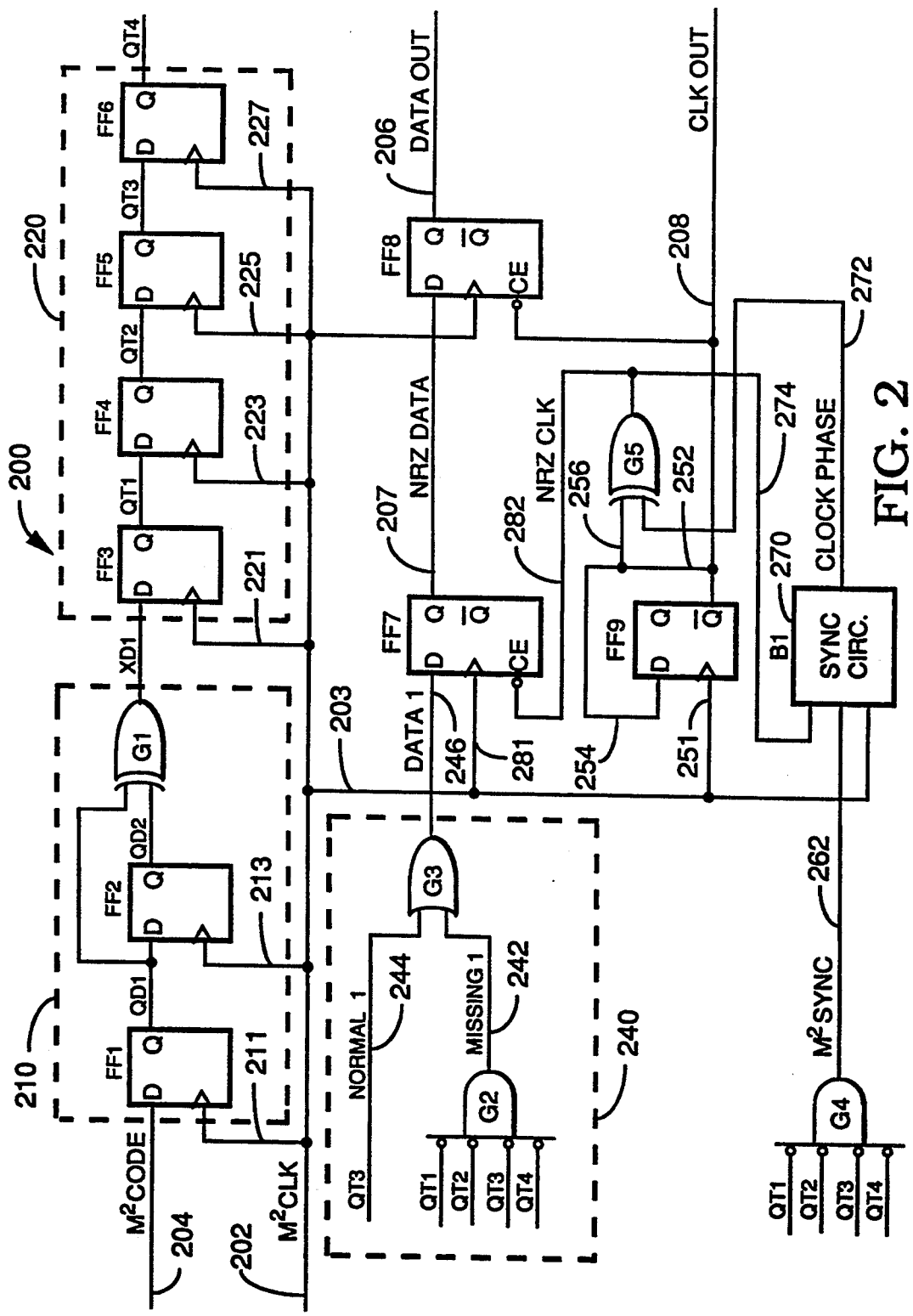
FIG. 2 is a prior art logic circuit diagram of one form of Miller-squared decoder.
Figure 3:
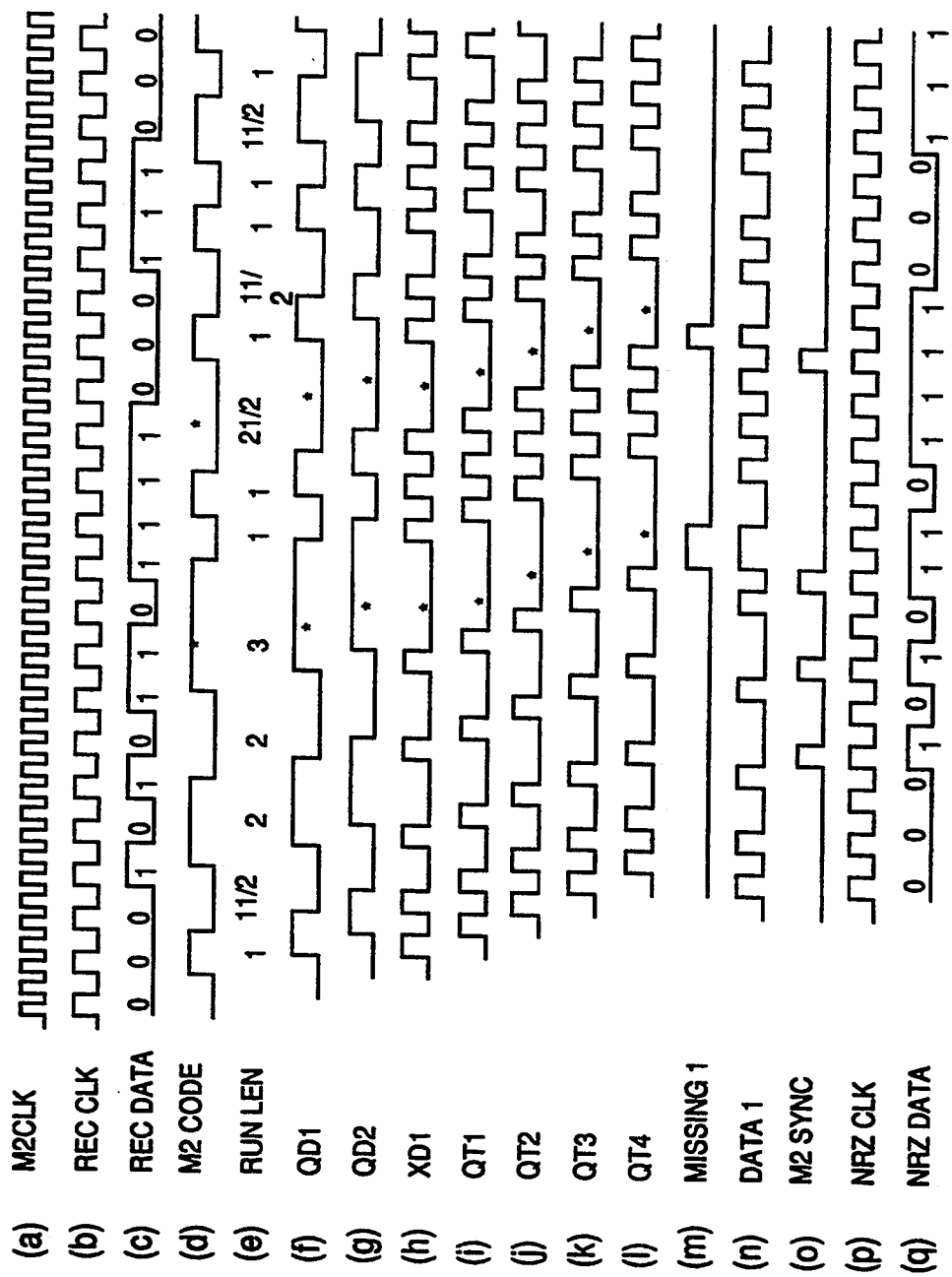
FIG. 3 is a timing diagram associated with the Miller-squared decoder of FIG. 2.

FIG. 2 illustrates, in logic diagram form, a conventional $M^2$ decoder, generally designated 200, while FIG. 3 depicts a timing diagram illustrating the operation of the circuit of FIG. 2 in decoding a valid or legal $M^2$ code sequence and relevant signals thereof. In general, the timing diagram of FIG. 3 depicts signal waveforms applicable to the operation of the logic shown in FIG. 2 and, in which, the waveforms are vertically related in time. In the timing diagrams, an "*" indicates, a missing "1" transition according to the $M^2$ coding rules. A "?" indicates uncertain data due to data error(s). An "X" indicates incorrect data due to data error(s). A row, designated RUN LEN, e.g. FIG. 3(e), appearing below the $M^2$ CODE waveform line in the diagram refers to the $M^2$ CODE code run length associated with the particular transitions.

A record data stream REC DATA [3(c)] contains two "101" sequences near the start which determine the correct phase of the decoder NRZ clock. There is also a code run length of 2-½ and 3 data cells illustrating the "missing 1" detection. As explained earlier, a run length of one data cell is the equivalent of one NRZ clock [3(p)] period as illustrated in FIG. 3 or two $M^2$ clock periods.

As shown in FIG. 2, the $M^2$ decoder 200 receives a $M^2$ CLK signal [3(a)] over path 202 and a $M^2$ encoded data stream $M^2$ CODE [3(d)] over path 204. The original data protocol, prior to $M^2$ encoding, such as NRZ-L and its associated clock, is restored as $M^2$ decoder 200 output, which includes a NRZ-L [3(q)] data stream DATA OUT (see NRZ DATA) on path 206, and a CLK OUT (see NRZ CLK) signal on path 208, from flip-flops FF8 and FF9, respectively as will be described.

A $M^2$ signal phase transition detection logic 210 including flip flops FF1, FF2 and a XOR gate G1, is configured to output a signal XD1 as shown in FIG. 3(h), the signal XD1 having discrete pulses each representative of a $M^2$ data code transition. Flip flop FF1's D terminal receives the signal $M^2$ CODE and flip flop FF2's D terminal connects to flip flop FF1's Q terminal. Both flip flops FF1 and FF2 are clocked over leads 211 and 213, respectively, by the $M^2$ CLK signal on lead 202. While the flip flops FF1 and FF2 form a 2-bit shift register, the XOR gate G1, being sensitive to $M^2$ data code phase transitions, operates on two Q terminal output, signals QD1 [3(f)] and QD2 [3(g)] as shown in FIG. 3 each arising from its associated flip flops FF1 and FF2. The XOR gate G1 output XD1 is "1" for one $M^2$ clock whenever there is a transition in the $M^2$ code stream.

A data shifter 220 comprising Of a cascaded series of flip flops FF3, FF4, FF5, and FF6 each is clocked by the signal M2 CLK via paths 202, 221; 202, 223; 202, 225; and 202, 227 respectively, the data shifter 220 receives the signal XD1 into a terminal D of the flip flop FF3. The flip flops' Q terminal output, signals QT1 [3(i)], QT2 [3(j)], QT3 [3(k)] and QT4 [3(l)] as shown in FIG. 3, each is applied to a D terminal of the subsequent flip flop except for the last flip flop FF6. These four flip flops form a 4-bit shift register containing a pattern of $M^2$ data code transitions. Signals QT1–QT4 are subsequently used in the $M^2$ decoder 200 to determine the original NRZ data waveform and clock information.

A Data-1 detection logic 240 includes an AND gate G2 and an OR gate G3. Signals QT1–QT4 are input to the AND gate G2 and its output, a signal MISSING-1 [3(m)] indicative of a suppressed "1", via a path 242 is operated on by the OR gate G3 also having signal QT3 as the other input over a path 244 resulting in a signal DATA-1 as shown in FIG. 2 on a path 246. Signal QT3 is "1" when there is a transition in the middle of a data cell, indicating a normal data "1". Signal MISSING-1 is "1" when there is a run length of 2.5 or 3 data cells, also indicating a data "1" which is suppressed according to the $M^2$ coding rules. This is also referred to as a "missing 1 transition". There are two "missing 1 transitions" in FIG. 3, both marked with "*". Signal DATA-1 [3(n)] is "1" if either condition, the normal data "1" or the missing data "1", indicating a data "1" is true.

An AND gate G4 having signals QT1, QT2, QT3, and QT4 as input, output a signal $M^2$ SYNC as shown in FIG. 3(o) over a path 262 leading to a sync circuit logic 270 which is clocked by signal $M^2$ CLK via paths 202, 203. Signal $M^2$ SYNC is "1" for one or more M2 clock when there is a transition followed by a run length of two or more data cells. This signal $M^2$ SYNC is typically generated by a "101" data sequence, and allows the phase of the decoder NRZ clock to be correctly synchronized. A signal CLOCK-PHASE (not shown in FIG. 3) from the sync circuit logic 270 over a path 272 inputs into an XOR gate G5 which has its output, a signal NRZ CLK [3(p)] returning into the sync circuit logic 270 via a path 274. The sync circuit logic 270 ensures that signal NRZ CLK is high when signal M2

SYNC is high, which is the condition for correct phasing of signal NRZ CLK. If signal NRZ CLK is low several successive times when signal $M^2$ SYNC is high, then signal CLOCK-PHASE is toggled, which inverts the phase of signal NRZ CLK. A flip flop FF9, also being clocked by signal $M^2$ CLK via paths 202, 203, and 251, is configured as a frequency divider creating signal CLK OUT, the desired NRZ frequency clock. FF9's Q terminal which connects to FF9's own D terminal via paths 208, 252, 254 and to the XOR gate G5 via paths 208, 252, 256. Signal NRZ CLK, over a path 274, 282, enables a flip flop FF7 which receives signal DATA-1 into its D terminal over the path 246 and outputs a signal NRZ DATA as shown in FIG. 2 to its Q terminal. FF7 is clocked by signal $M^2$ CLK via paths 202, 203, and 281. The flip flop FF9 is enabled every other $M^2$ clock as indicated by the signal NRZ CLK during the time when signal QT3 corresponds to the middle of the data cell. Signal NRZ DATA is buffered by a flip flop FF8 before becoming signal DATA OUT, the desired data. Flip flop FF8 reclocks the decoded data, eliminating any "glitches" in the output when signal CLK PHASE changes phase.

Figure 4:
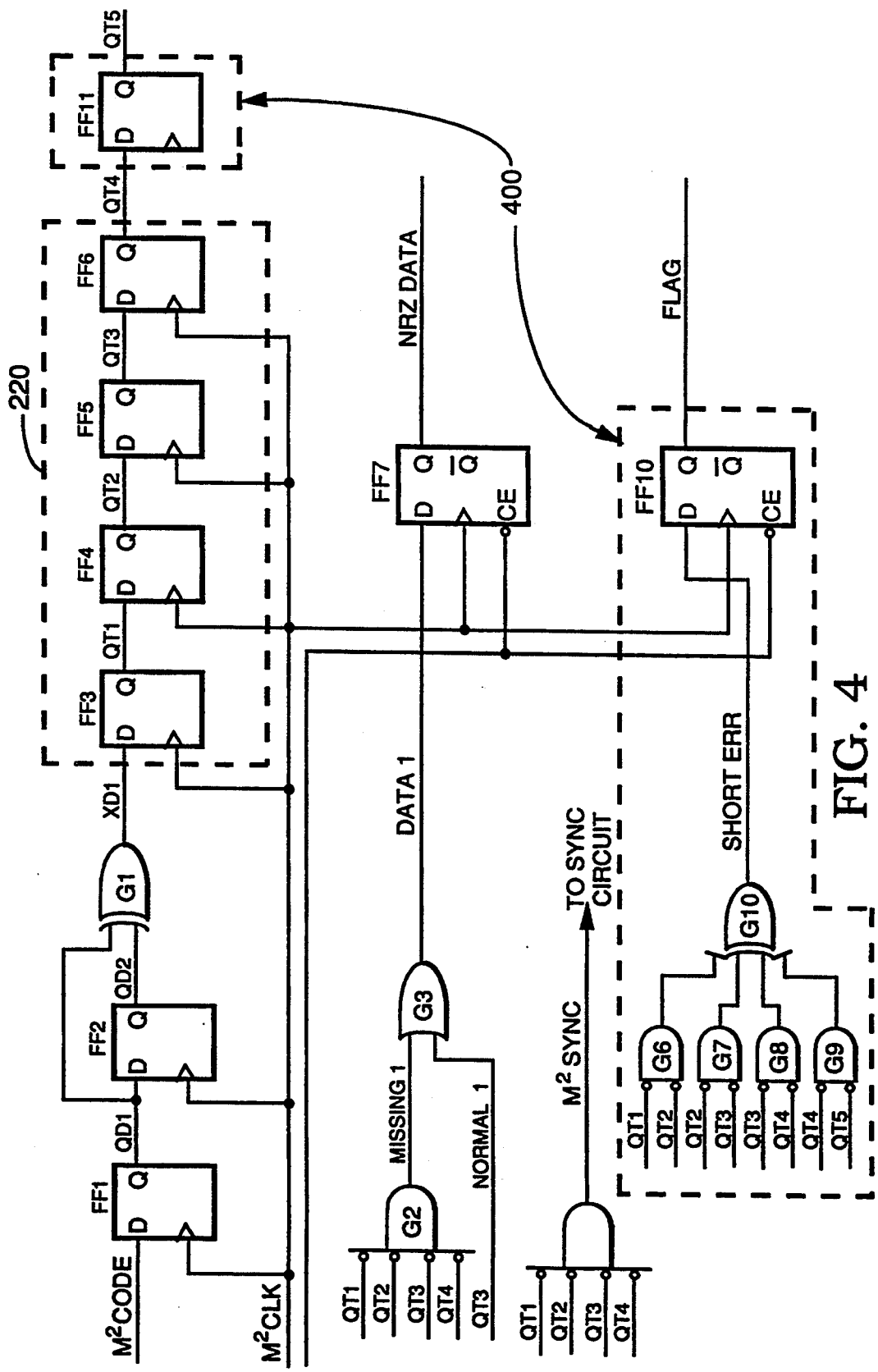
FIG. 4 is a circuit diagram of a Miller-squared decoder with short run violation logic in accordance to the present invention.
Figure 5:
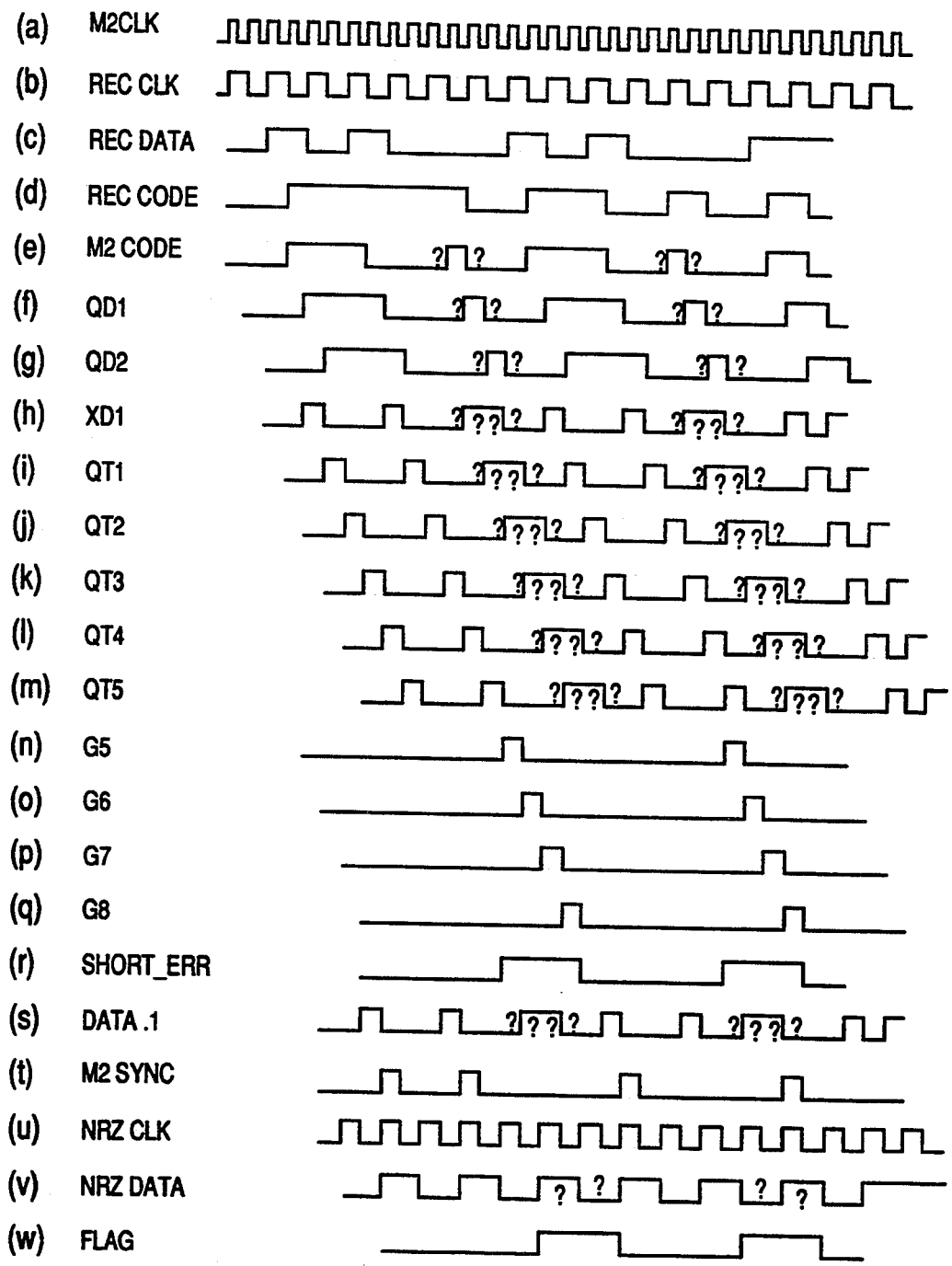
FIG. 5 is a timing diagram of signal waveforms associated with the Miller-squared decoder in FIG. 4.

Referring to FIGS. 4 and 5, there is provided in accordance with the present invention a $M^2$ decoder of FIG. 2 with circuitry added for detecting and flagging short run violation errors. For purposes of clarity, the sync circuit logic 270 and logic FF8, FF9 and G5 of FIG. 2 are not shown. The short run violation logic 400 includes flip flops FF10, and FF11, AND gates G6, G7, G8 and G9, and an OR gate G10. The data shifter 220 of FIG. 2 has been expanded to a 5-bit shift register FF3, FF4, FF5, FF6, and FF11 in FIG. 4. Of them FF11 output QT5 at its Q terminal serving as an input to AND gate G9. In addition, AND gates G6-G9 and OR gate G10 are added to detect short run violations.

FIG. 5 is a timing diagram in which waveforms are vertically related in time, illustrating the operation of the circuit of FIG. 4. The REC DATA in FIG. 5(c) depicting the original data content and REC CODE [5(d)] depicting the corresponding $M^2$ code sequences are included for reference although the decoder does not "know" about them. $M^2$ CODE in FIG. 5(e) contains two short run violations. Each violation consists of a pair of $M^2$ code transitions separated by one $M^2$ clock. There are two possible error locations, both marked with (?), since the decoder does not know which transition was shifted. In the data shifter 220 FF3-FF6, and its addition FF11, there are two consecutive taps which are high and four possible error locations for each violation, due to the operation of XOR gate G1. AND gate G6 output is high when taps QT1 [5(i)] and QT2 [5 (j)] are both high. AND gate G7 output will be high on the following M2 clock when taps QT2 [5(j)] and OT3 [5(k)] are both high. Similarly, AND gates G8 and G9 will be high on the next two $M^2$ clocks respectively. OR gate G10 output SHORT—ERR [5(r)] will be high whenever any of the AND gates G6-G9 are high. Thus SHORT—ERR will be high for four $M^2$ clocks or two data cell periods whenever a short run violation occurs. This causes two decoded data bits to be flagged as uncertain. Signal SHORT—ERR is buffered by the flip flop FF10 before becoming a signal FLAG [5(w)], the desired output indicative of data error position.

Figure 6:
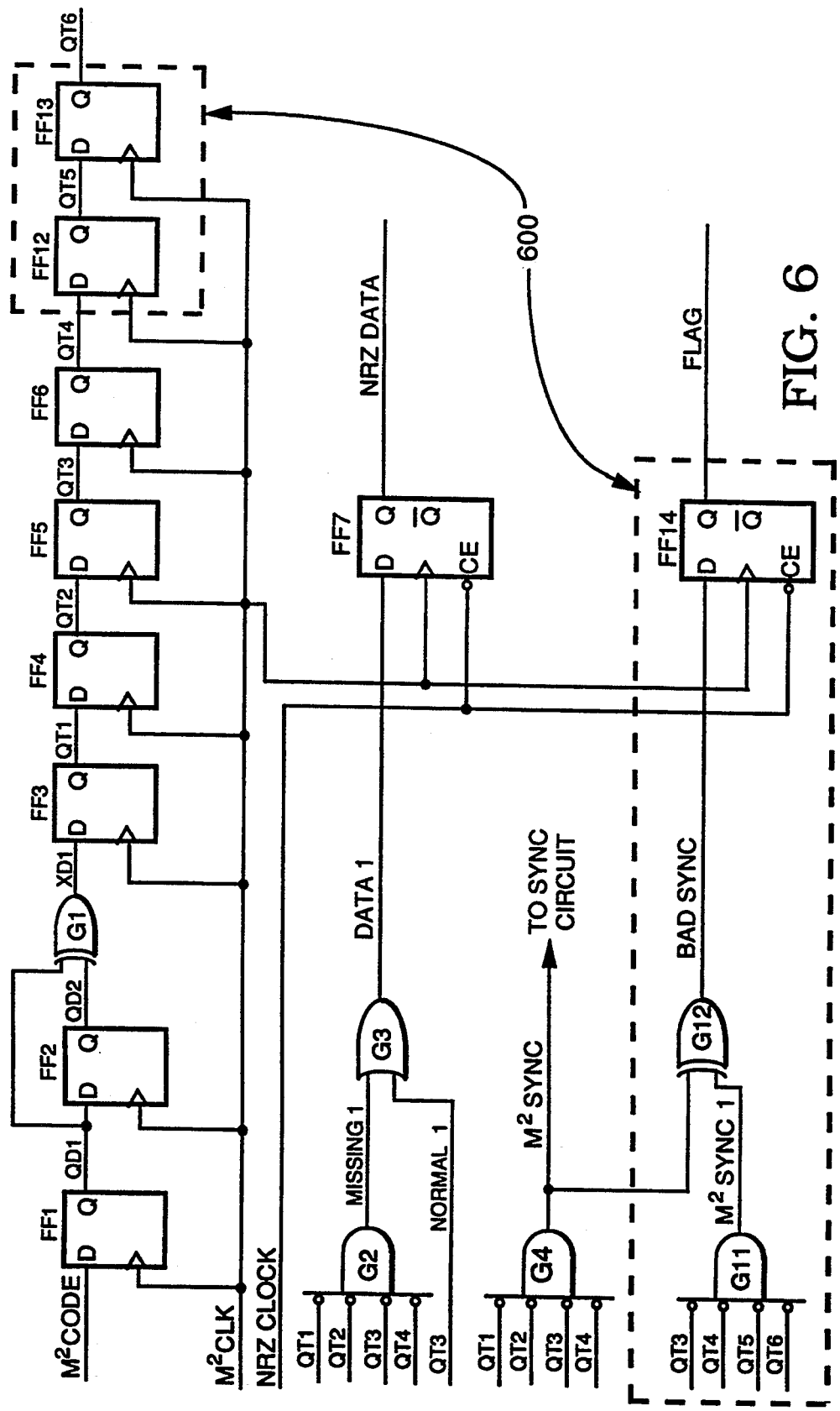
FIG. 6 is a circuit diagram of a Miller-squared decoder with illegal sync violation logic in accordance to the present invention.
Figure 7:
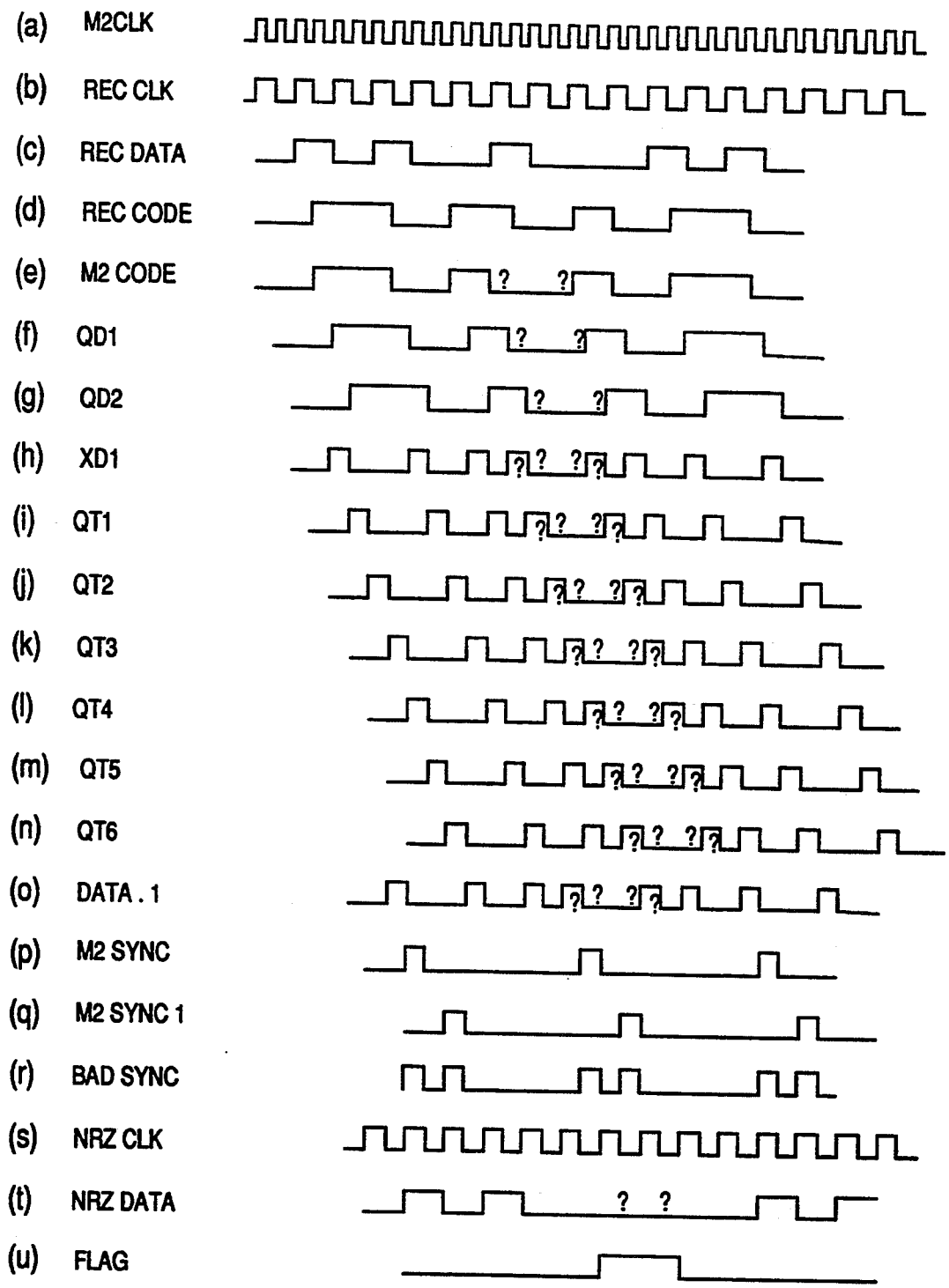
FIG. 7 is a timing diagram of signal waveforms associated with the Miller-squared decoder in FIG. 6.

Referring to FIGS. 6 and 7, there is another embodiment of the present invention. FIG. 6 illustrates a $M^2$ decoder of FIG. 2 with circuitry added for detecting and flagging illegal $M^2$ sync sequences. For purposes of clarity, the sync circuit logic 270 and logic FF8, FF9 and G5 of FIG. 2 are not shown. The illegal sync violation logic 600 includes flip flops FF12, FF13, and FF14, a AND gate G11 and a OR gate G12. The added circuitry is enclosed by dashed lines. The 4-bit shift register (FF3–FF6) of FIG. 2 has been expanded to a 6-bit shift register (FF3–FF6, FF12, FF13) in FIG. 6. Of them, FF12 output QT5 and FF13 output QT6 in their Q terminals. Both of which are input to AND gate G11 with QT3 and QT4. In addition, gates G11–G12 and flip-flop FF14 have been added to detect illegal $M^2$ sync sequences.

FIG. 7 is a timing diagram, having waveforms therein vertically related in time, illustrating the operation of the circuit of FIG. 6. Again, REC DATA [7(c)] and REC CODE [7(d)] are included for reference. $M^2$ CODE in FIG. 7(e) contains an illegal $M^2$ sync sequence, consisting of a pair of M2 code transitions separated by four $M^2$ clocks with the initial transition falling on the boundary between two data cells. There are two possible error locations, both marked with (?), since the decoder does not know which transition was shifted. In shift register FF3–FF6 and FF12–FF13, there are four possible error locations, due to the operation of XOR gate G1. AND gate G4 output $M^2$ SYNC [7(p)] is high when tap QT4 [7(l)] is high and taps QT1 [7(i)], QT2 [7(j)] and QT3 [7(k)] are all low. AND gate G11 output M2 SYNC1 [7(q)] will be high two $M^2$ clocks later. OR gate G12 output BAD SYNC [7(r)] will be high when either $M^2$ SYNC or $M^2$ SYNC1 is high. The timing relationship of BAD SYNC and NRZ CLK is such that BAD SYNC high and NRZ CLK low indicates $M^2$ sync sequence is illegal. Thus, two decoded data bits are flagged as uncertain whenever an illegal $M^2$ sync sequence occurs. Signal BAD SYNC is buffered by the flip flop FF14 before becoming a signal FLAG [7(u)], the desired output indicative of data error position.

In valid $M^2$ code, the longest run length between a pair of transitions is six $M^2$ clocks. If a playback error causes either the first transition to occur sooner or the second transition to occur later, a long run length violation occurs. The former case also results in an illegal $M^2$ sequence, which is detected and flagged by the logic of FIG. 6. Thus only the second case need be separately detected.

Figure 8:
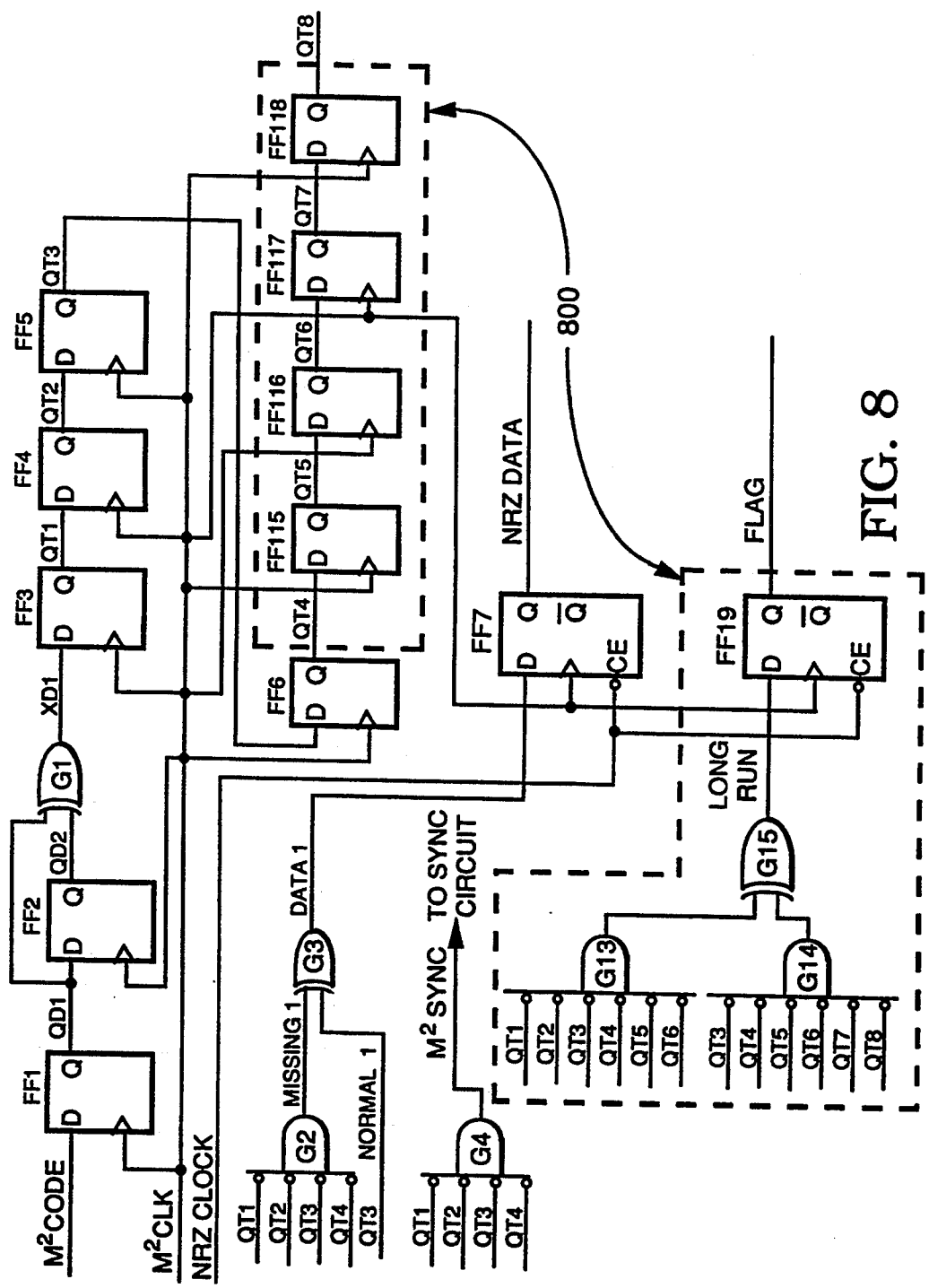
FIG. 8 is a circuit diagram of a Miller-squared decoder with long run violation logic in accordance to the present invention.
Figure 9:
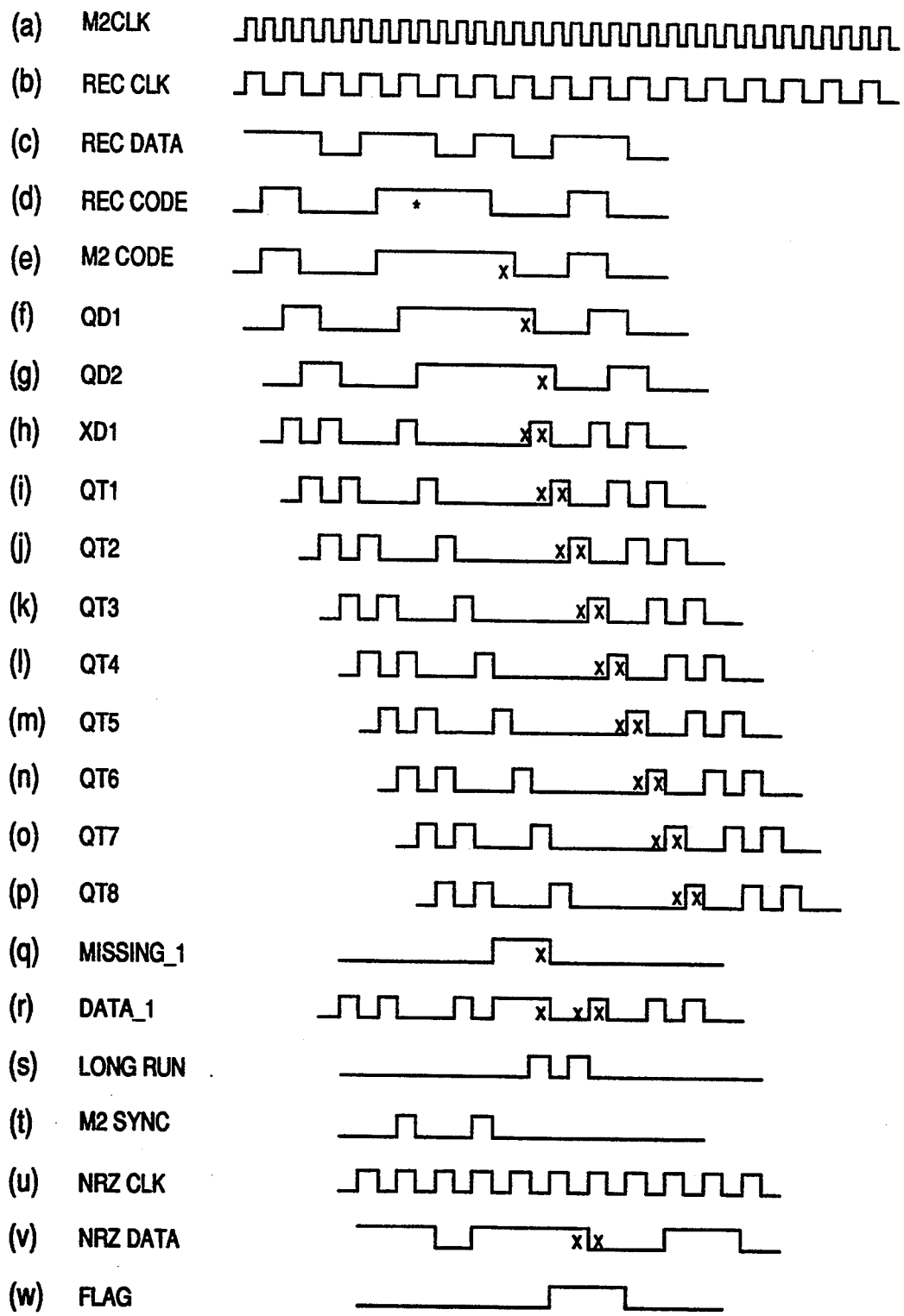
FIG. 9 is a timing diagram of signal waveforms associated with the M2 decoder in FIG. 8.

Referring to FIGS. 8 and 9, this is another embodiment of the present invention. FIG. 8 illustrates the $M^2$ decoder of FIG. 2 with circuitry added for detecting and flagging long run violations. For purposes of clarity, the sync circuit logic 270 and logic FF8, FF9 and G5 of FIG. 2 are not shown. The long run violation logic 800 includes flip flops FF15–FF19, AND gates G13 and G14, and an OR gate G15. The added circuitry is enclosed by dashed lines. The 4-bit shift register (FF3–FF6) of FIG. 2 has been expanded to a 8-bit shift register (FF3–FF6, FF15–FF18) in FIG. 6. Each Q terminal output of flip flops FF15–FF18, QT5, QT6, QT7 and QT8, is fed into the long run violation logic 800. In addition, gates G13–G15 and flip flop FF19 have been added to detect long run violations.

FIG. 9, having waveforms vertically related in time, is a timing diagram illustrating the operation of the circuit of FIG. 8. $M^2$ CODE in FIG. 9(e) contains a long run violation, consisting of a pair of M2 code transitions separated by seven $M^2$ clocks. The error location is marked with a (X). In this case, the decoder knows the ending transition was shifted because the beginning transition occurs in the middle of a data cell. In shift register FF3–FF6 and FF15–FF18, there are six consecutive taps which are low and two error locations, due to the operation of XOR gate G1. There are two incorrectly decoded data bits. One corresponds to an incorrect bit at shift register tap QT3 [9(k)]. The other occurs because gate G2 output MISSING-1 [9(q)] is incorrectly high corresponding to an incorrect zero bit at shift register tap QT1 [9(i)]. AND gate G13 output is high when taps QT1–QT6 [9(i–n)] are all low. AND gate G14 output is high two $M^2$ clocks later. OR gate G15 output LONG RUN [9(s)] is high if either G13 or G14 is high. The timing relationship between LONG RUN and NRZ CLK [9(w)] is such that whenever LONG RUN is high, NRZ CLK is high if the error occurred at the beginning of the long run violation and NRZ CLK is low if the error occurred at the end of the long run violation. The first case is detected by the circuit of FIG. 6 and in the second case the circuit of FIG. 8 flags the two decoded data bits which are erroneously decoded.

To detect and flag various types of illegal $M^2$ sequences, the appropriate circuitry from FIGS. 4, 6 and 8 should be combined and added to the circuit of FIG. 2. In such a case, FLAG signals from FIGS. 4, 6 or 8 can be merged through an OR logic, equivalently OR gates G10, G12 and G15 in FIGS. 4, 6 and 8 respectively, may be combined into a single OR gate. Furthermore, FLAG and NRZ DATA signals in FIGS. 4, 6 and 8 can each be reclocked by a flip flop configured as FF8 in FIG. 2 for a better signal quality.

The present invention and its various embodiments may be implemented in various types of digital logic families or technology. Logic reduction and transformation techniques may be employed to utilize other arrangements of gates or logic elements which are functionally equivalent to the one described here.

I claim:

1. A decoder in a transmission system for converting an encoded input serial data stream into an output data stream, said input data stream being encoded according to at least two coding formats, one such coding format, a channel code, enabling said input serial data stream to be generally free of any net DC component and another such coding format, an error correction code providing data redundancy to said input data stream, said decoder comprising:
   means for receiving said input data stream;
   means for decoding serially said input data stream according to said channel code for generating a first data stream generally representative of said input data stream;
   means for determining if said input data stream conforms to said channel code;
   means responsive to said determining means for generating a signal indicative of a violation of said channel code arising from a data error;
   means for transmitting said signal in synchronism with said first data stream, said signal being indicative of one or more data bit locations at which a data error occurs in said first data stream; and
   other means responsive to said signal and said first data stream for decoding said first data stream according to said error correction code for generating said output data stream.

2. The decoder according to claim 1 wherein said signal is an erasure flag signal.

3. The decoder according to claim 1 wherein said signal is a pulse, the initiation and duration are indicative of said data error in said input data stream.

4. The decoder according to claim 3 wherein said signal is further indicative of two likely data bits in said first data stream one of which contains said data error.

5. The decoder according to claim 1 wherein said signal, indicative of said channel code violation having a pulse sequence in said input data stream, said signal departs said decoding means simultaneously with a portion of said first data stream representative of said pulse sequence.

6. The decoder according to claim 1 wherein said signal is output separately from said first data stream.

7. A decoder for converting a serially clocked and encoded input binary data stream into an output data stream, said input data stream being encoded according to the Miller-squared ($M^2$) channel code and according to a data error correction code, said decoder comprising:
   decoding means for said input data stream for generating a first data stream;
   detection means for identifying data sequences in said input data stream not conforming to said $M^2$ channel code;
   indication means responsive to said data sequences for producing signal flags indicative of data error positions, said signal flags in synchronism with said first data stream and simultaneously with a portion of said first data stream representative of said data sequences in said input data stream; and
   other means responsive to said signal and said first data stream for decoding said first data stream according to said data error correction code for generating said output data stream.

8. The decoder according to claim 7 wherein said first data stream includes binary data in Non-Return-To-Zero (NRZ) format having a NRZ clock at half of the Miller-squared ($M^2$) clock frequency.

9. The decoder according to claim 7 having said input data stream clocked by a Miller-squared ($M^2$) frequency waveform wherein said data sequences include two consecutive signal phase transitions in said input data stream spanning less than two clock periods as defined by said $M^2$ clock frequency.

10. The decoder according to claim 7 having said input data stream clocked by a Miller-squared ($M^2$) frequency waveform wherein said data sequences include two consecutive signal phase transitions in said input data stream spanning greater than six clock periods as defined by said $M^2$ clock frequency.

11. The decoder according to claim 7 having said input data stream clocked by a Miller-squared ($M^2$) frequency waveform wherein said data sequences include a first signal phase transition in said input data stream occurring between data cells as defined by said $M^2$ clock frequency and a successive second signal phase transition in said input data stream occurring subsequent to said first signal phase transition, both signal phase transitions spanning at least four clock periods as defined by said $M^2$ clock frequency.

12. The decoder according to claim 7 wherein said data error correction code includes a Reed-Solomon code.

13. A decoder receiving from a transmission channel according to a channel code a self-clocking encoded binary data signal sequentially in successive clocked bit cells modified to remove any net DC component in an otherwise normal transmission having logical first bit states normally transmitted as signal phase transitions relatively early in respective bit cells and logical second bit states normally transmitted as signal phase transitions relatively late in respective bit cells and any transition relatively early in a bit cell following a transition relatively late in the next preceding bit cell is suppressed, said decoder comprising:

means for decoding said binary data signal for generating a first data stream;

detection means for identifying data sequences in said binary data signal not conforming to said channel code; and indication means responsive to said data sequences for producing signal flags indicative of data error positions, said signal flags in synchronism with said first data stream and simultaneously with a portion of said first data stream representative of said data sequences.

14. The decoder according to claim 13 wherein said first data stream includes binary data in Non-Return-To-Zero (NRZ) format.

15. The decoder according to claim 13 having said binary data signal clocked at a frequency according to said channel code wherein said data sequences include two consecutive signal phase transitions in said binary data signal spanning less than two clock periods as defined by said clock frequency.

16. The decoder according to claim 13 having said binary data signal clocked at a frequency according to said channel code wherein said data sequences include two consecutive signal phase transitions in said binary data signal spanning greater than six clock periods as defined by said clock frequency.

17. The decoder according to claim 13 having said binary data signal clocked at a frequency according to said channel code wherein said data sequences include a first signal phase transition in said binary data signal occurring between bit cells as defined by said clock frequency and a successive second signal phase transition in said binary data signal occurring subsequent to said first signal phase transition, both signal phase transitions spanning at least four clock periods as defined by said clock frequency.

18. A decoding method in a transmission system for converting an encoded input serial data stream into an output data stream, said input data stream being encoded according to at least two coding formats, one such coding format, a channel code, enabling said input serial data stream to be generally free of any net DC component and another such coding format, an error correction code providing data redundancy to said input data stream, said method comprising the steps of:

receiving said input data stream;

decoding serially said input data stream according to said channel code for generating a first data stream generally representative of said input data stream;

determining if said input data stream conforms to said channel code;

generating in response to said determining step a signal indicative of a violation of said channel code arising from a data error;

transmitting said signal in synchronism with said first data stream, said signal being indicative of one or more data bit locations at which a data error occurs in said first data stream; and decoding in response to said signal and said first data stream, said first data stream according to said error correction code for generating said output data Stream.

19. The decoding method according to claim 18 wherein said signal is an erasure flag signal.

20. The decoding method according to claim 18 wherein said signal is a pulse, the initiation and duration are indicative of said data error in said input data stream.

21. The decoding method according to claim 20 wherein said signal is further indicative of two likely data bits in said first data stream one of which contains said data error.

22. The decoding method according to claim 18 wherein said signal, indicative of said channel code violation having a pulse sequence in said input data stream, said transmitting step causing said signal to be simultaneously with a portion of said first data stream representative of said pulse sequence.

23. The decoding method according to claim 18 wherein said signal is output separately from said first data stream.

24. A decoding method for converting a serially clocked and encoded input binary data stream into an output data stream, said input data stream being encoded according to the Miller-squared ($M^2$) channel code and according to a data error correction code, said decoding method comprising the steps of:

decoding said input data stream for generating a first data stream;

identifying data sequences in said input data stream not conforming to said $M^2$ channel code;

indicating responsive to said data sequences for producing signal flags indicative of data error positions, said signal flags in sychronism with said first data stream and simultaneously with a portion of said first data stream representative of said data sequences in said input data stream; and decoding in response to said signal and said first data stream, said first data stream according to said data error correction code for generating said output data stream.

25. The decoding method according to claim 24 wherein said first data stream represents binary data in Non-Return-To-Zero (NRZ) format having a NRZ clock at half of the Miller-squared ($M^2$) clock frequency.

26. The decoding method according to claim 24 having said input data stream clocked by a Miller-squared ($M^2$) frequency waveform wherein said data sequences include two consecutive signal phase transitions in said input data stream spanning less than two clock periods as defined by said $M^2$ clock frequency.

27. The decoding method according to claim 24 having said input data stream clocked by a Miller-squared ($M^2$) frequency waveform wherein said data sequences include two consecutive signal phase transitions in said input data stream spanning greater than six clock periods as defined by said M2 clock frequency.

28. The decoding method according to claim 24 having said input data stream clocked by a Miller-squared ($M^2$) frequency waveform wherein said data sequences include a first signal phase transition in said input data stream occurring between data cells as defined by said $M^2$ clock frequency and a successive second signal phase transition in said input data stream occurring subsequent to said first signal phase transition, both signal phase transitions spanning at least four clock periods as defined by said M2 clock frequency.

29. A decoding method processing a self-clocking encoded binary data signal from a transmission channel according to a channel code, said binary data signal traveling sequentially in successive clocked bit cells modified to remove any net DC component in an otherwise normal transmission having logical first bit states normally transmitted as signal phase transitions relatively early in respective bit cells and logical second bit states normally transmitted as signal phase transitions relatively late in respective bit cells and any transition relatively early in a bit cell following a transition relatively late in the next preceding bit cell is suppressed, said decoding method comprising the steps of:

decoding said binary data signal for generating a first data stream;

identifying data sequences in said binary data signal not conforming to said channel code; and indicating in response to said data sequences signal flags indicative of data error position, said signal flags in sychronism with said first data stream and simultaneously with a portion of said first data stream representative of said data sequences.

30. The decoding method according to claim 29 wherein said first data stream includes binary data in Non-Return-To-Zero (NRZ) format.

31. The decoding method according to claim 29 having said binary data signal clocked at a frequency according to said channel code wherein said data sequences include two consecutive signal phase transitions in said binary data signal spanning less than two clock periods as defined by said clock frequency.

32. The decoding method according to claim 29 having said binary data signal clocked at a frequency according to said channel code wherein said data sequences include two consecutive signal phase transitions in said binary data signal spanning greater than six clock periods as defined by said clock frequency.

33. The decoding according to claim 29 having said binary data signal clocked at a frequency according to said channel code wherein said data sequences include a first signal phase transition in said binary data signal occurring between bit cells as defined by said clock frequency and a successive second signal phase transition in said binary data signal occurring subsequent to said first signal phase transition, both signal phase transitions spanning at least four clock periods as defined by said clock frequency.

* * * * *